United States Patent [19]

Nishikawa et al.

[11] Patent Number: 4,502,024
[45] Date of Patent: Feb. 26, 1985

[54] PULSE-WIDTH MODULATION CIRCUIT

[75] Inventors: Meisei Nishikawa, Yokohama; Masahide Nagumo, Kawasaki; Tadashi Kojima, Yokosuka, all of Japan

[73] Assignee: Tokyo Shibaura Denki Kabushiki Kaisha, Kawasaki, Japan

[21] Appl. No.: 473,763

[22] Filed: Mar. 10, 1983

[30] Foreign Application Priority Data

Jun. 15, 1982 [JP] Japan .................... 57-102821
Dec. 22, 1982 [JP] Japan .................... 57-225217

[51] Int. Cl.³ ............................................. H03K 7/08
[52] U.S. Cl. ......................................... 332/9 R; 375/22
[58] Field of Search ...................... 332/9 R; 375/22

[56] References Cited

U.S. PATENT DOCUMENTS

| 2,894,254 | 7/1959 | Mork | 340/347 |
| 3,078,451 | 9/1974 | Kitano | 328/58 |
| 3,836,858 | 2/1963 | Sable | 340/347 |
| 4,138,632 | 2/1979 | Pauwels et al. | 332/9 R X |
| 4,206,432 | 6/1980 | Nossen | 332/9 R |

FOREIGN PATENT DOCUMENTS 11493 5/1980 European Pat. Off. .

OTHER PUBLICATIONS

Anon, "Digitally Controlled Pulse Width Modulator", Jul. 1975, *Electronic Engineering*, p. 15.

Primary Examiner—Eugene R. Laroche
Assistant Examiner—Robert J. Pascal
Attorney, Agent, or Firm—Cushman, Darby & Cushman

[57] ABSTRACT

The invention provides a pulse-width modulation circuit in which an output from a latch circuit for holding a count obtained by counting a reference clock signal in accordance with the period of a signal to be modulated is compared by a comparator with an output from a ramp counter for counting the reference clock signal at a predetermined period so as to perform a pulse-width modulation. The number of bits of the comparator and the ramp counter is decreased by n bits with respect to the number N (N>n) of bits of the latch circuit.

3 Claims, 35 Drawing Figures

F I G. 11
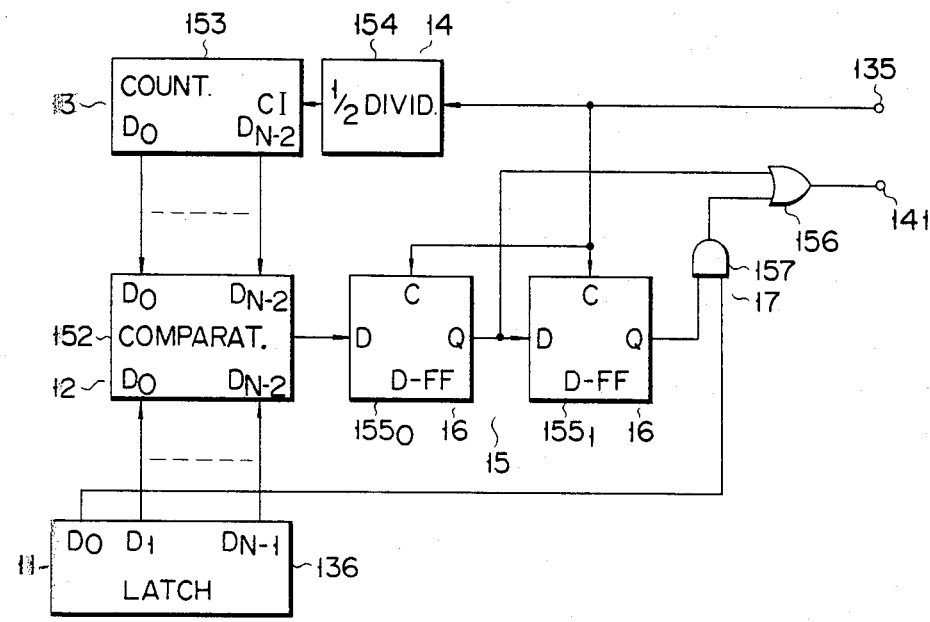
F I G. 12
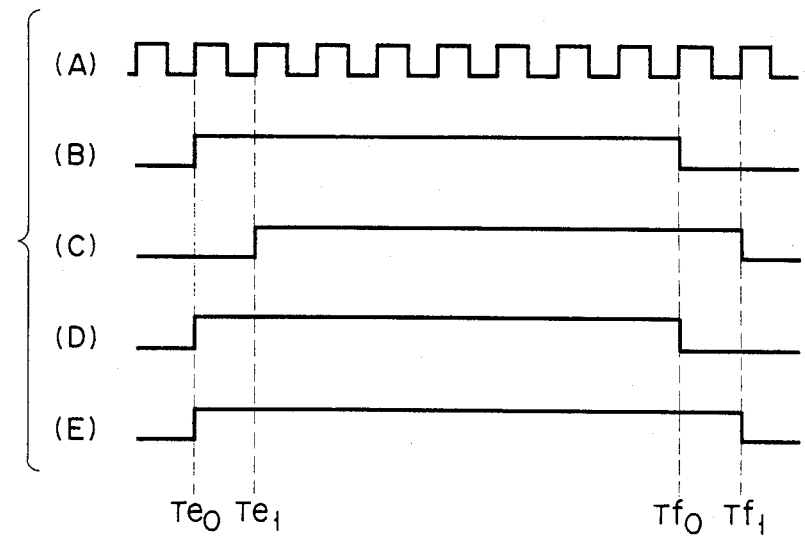

PULSE-WIDTH MODULATION CIRCUIT

BACKGROUND OF THE INVENTION

The present invention relates to an improvement of a pulse-width modulation (PWM) circuit suitable for controlling a disk motor of a DAD (digital audio disk) reproduction circuit of a CD (optical compact disk) type.

A PCM (pulse code modulation) digital recording/reproduction system has been recently adopted in order to achieve a higher fidelity in acoustic equipment. This is because a digital audio technique has been established which provides better audio characteristics than the conventional analog recording/reproduction systems without dependency on the characteristics of a recording medium.

Among the digital audio systems, there is a system called a DAD system which records signals on and reproduces them from a recording disk. Various recording/reproduction systems for the DAD system have been proposed such as optical, electrostatic and mechanical systems. Whichever one of these recording/reproduction systems is used, the data reproduction apparatus must satisfy various control functions and high-performance requirements which are higher than those of the conventional data reproduction apparatus.

In a CD reproduction apparatus, for example, a disk is used which comprises a transparent plastic disk 12 cm in diameter and 1.2 mm thick, with a thin metal film formed on the transparent plastic disk. Pits (indentation patterns of different reflectivities) are formed in the thin metal film to correspond to digital (PCM) data. The CD disk is scanned by an optical pickup which is moved from the innermost track to the outermost track in the radial direction of the CD disk. An optical pickup which has a semiconductor laser and a photoelectric transducer therein is used to scan the rotating CD disk. The CD disk must be rotated at a constant linear velocity (CLV) all the time. The speed of rotation of the CD disk must therefore continuously change from 500 rpm to 200 rpm as the optical pickup moves from the innermost track to the outermost track. Since the CD disk has a track pitch of 1.6 μm to allow one-hour stereo playing on one side thereof, a great amount of data may be recorded on the CD disk in a program area (at a radius of 25 to 58 mm), and index data thereof are recorded on a lead-in area (at a radius of 23 to 25 mm). As a result, highly precise control functions and the like are required.

In a digital disk player of the type described above, it is very important to drive the disk motor, and hence, the optical disk, at a constant linear velocity, thereby properly reproducing a digital signal from the optical disk.

The disk motor is controlled such that the frequency and phase of a sync signal recorded together with the digital signal coincide with those of a reference signal using a reference clock signal. In this case, pulse-width modulated signals corresponding to deviations in the frequency and phase of the sync signal with those of the reference signal are detected. These pulse-width modulated signals are supplied to a disk motor through a low-pass filter to control the motor rotation at a constant linear velocity.

However, the conventional pulse-width modulating means has many disadvantages and a complex configuration, often resulting in erroneous operation. The conventional pulse-width modulating means is thus unsatisfactory for a variety of practical applications.

SUMMARY OF THE INVENTION

The present invention has been made in consideration of the conventional drawbacks, and has for its object to provide a pulse-width modulation circuit which is suitable for controlling a disk motor of a digital audio disk reproduction apparatus in particular, and which provides proper operation while employing a simple construction.

According to one aspect of the present invention, there is provided a pulse-width modulation circuit comprising N-bit latching means for holding count data obtained by counting a reference clock signal in accordance with a period of a signal to be modulated; frequency dividing means for frequency-dividing the reference clock signal by $\frac{1}{2}^n$ ($N>n$); ($N-n$)-bit counting means for counting an output from said frequency dividing means at a predetermined period; comparing means for comparing ($N-n$)-bit count data from said counting means and ($N-n$)-bit count data which is held in said latching means and which excludes n-bit data starting from a least significant bit of said latching means, and for producing a pulse-width modulation signal; delaying means for producing delayed signals by delaying outputs from said comparing means by single pulses of the reference clock signal, the delayed signals corresponding to the number of logic level combinations of the n-bit data starting from the least significant bit of said latching means; and selecting means for selecting the delayed signals from said delaying means in accordance with the number of logic level combinations of the n-bit data starting from the least significant bit of said latching means, and for adding at least one selected signal to the pulse-width modulation signal.

BRIEF DESCRIPTION OF THE DRAWINGS

FIG. 11 is a block diagram showing another modification of the pulse-width modulation circuit (FIG. 7) when a data area is decreased by 1 bit; and FIGS. 12A to 12E are timing charts for explaining the mode of operation of the circuit shown in FIG. 11.

DETAILED DESCRIPTION OF THE PREFERRED EMBODIMENT

A pulse-width modulation circuit according to an embodiment of the present invention will be described with reference to the accompanying drawings. Before the circuit is described in detail, a CD digital audio disk reproduction apparatus which uses a pulse-width modulation circuit of the present invention will be described with reference to FIG. 1.

Figure 1:
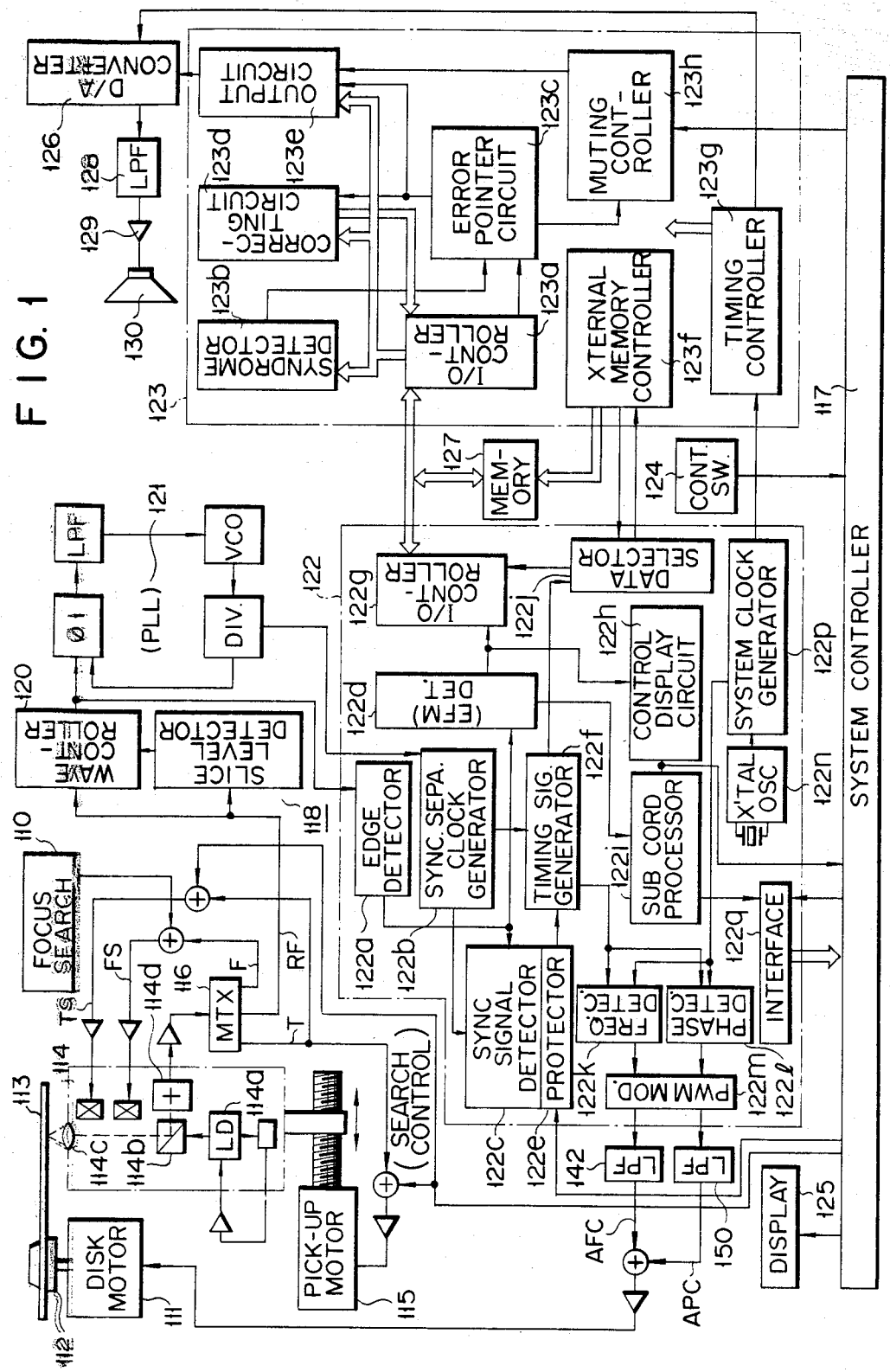
FIG. 1 is a block diagram showing the overall configuration of a digital audio disk reproduction apparatus to which a pulse-width modulation (PWM) circuit of the present invention is applied.

As shown in FIG. 1, the DAD apparatus comprises a disk motor 111 for rotating a turntable 112. An optical disk 113 is mounted on the turntable 112. The disk 113 has pits which correspond to digital audio signals (i.e., PCM codes) which have been EFM (Eight to Fourteen Modulation)-modulated and interleaved. An optical pickup 114 emits a laser beam from a semiconductor laser 114a. The laser beam passes through a beam splitter 114b and is focused by an objective lens 114c. The beam illuminates the track of the optical disk 113. The beam reflected from the pits passes through the objective lens 114c and the beam splitter 114b. It is then guided to a four-element photodetector 114d. The photodetector 114d converts the laser beam into four signals. The pickup 114 is moved by a pickup feed motor 115 in the radial direction of the optical disk 113.

The four signals from the photodetector 114d are supplied to a matrix circuit 116 and undergo a specific matrix operation. As a result, the matrix circuit 116 generates a focus error signal F, a tracking error signal T and a high-frequency signal RF. The focus error signal F and a focus search signal from a focus search circuit 110 are used to drive a focus servo system of the optical pickup 114. The tracking error signal T and a search control signal supplied from a system controller 117 are used to drive a tracking servo system of the optical pickup 114 and to control the pickup feed motor 115. The high-frequency signal RF is supplied to a reproduced signal processing system 118 as a major reproduced signal component. In the system 118 the signal RF is supplied to a waveform shaping circuit 120 which is controlled by a slice level (eye pattern) detector 119. The waveform shaping circuit 120 divides the input signal into an unnecessary analog component and a necessary data component. The necessary data component is supplied to a sync clock reproducing circuit 121 of PLL (phase locked loop) type and also to an edge detector 122a of a first signal processing system 122.

A sync clock from the sync clock reproducing circuit 121 is supplied to a clock-pulse generating circuit 122b of the first signal processing system 122. In response to the sync clock, the clock-pulse generating circuit 122b generates a clock-pulse for dividing a sync signal into components. On the other hand, the necessary data component from the edge detector 122a is supplied to a sync signal detector 122c. The sync signal detector 122c divides the data components in response to a sync signal dividing clock from the clock-pulse generating circuit 122b. The necessary data component from the edge detector 122a is also supplied to a demodulating circuit 122d and is then EMF-demodulated. A sync signal from the sync signal detector 122c is supplied to a sync signal protecting circuit 122e and then to a timing signal generating circuit 122f. A clock from the clockpulse generating circuit 122b is also supplied to the timing signal generating circuit 122f. The timing signal generating circuit 122f generates a timing signal for processing input data.

An output signal from the demodulating circuit 122d is supplied through a data bus input/output control circuit 122g to an input/output control circuit 123a of a second signal processing system 123. The output signal from the demodulating circuit 122d contains a sub-code (i.e., a control signal) and a display signal component. The display signal component is supplied to a control display processing circuit 122h and the sub-code is supplied to a sub-code processing circuit 122i.

The sub-code processing circuit 122i detects an error, if any, in the sub-code, corrects the error, and then generates sub-code data. The sub-code data is supplied to the system controller 117 through an interface circuit 122q which is connected to the system controller 117.

The system controller 117 includes a microcomputer, an interface circuit and a driver integrated circuit. In response to an instruction from a control switch 124 the system controller 117 controls the DAD apparatus in a desired manner and causes a display device 125 to display the sub-code (e.g., index data about a piece of music to be reproduced).

The timing signal from the timing signal generating circuit 122f is supplied through a data selecting circuit 122j to the data bus input/output control circuit 122g and controls the data bus input/output control circuit 122g. The timing signal is also supplied to a frequency detector 122k and a phase detector 122l, and also to a PWM (pulse width modulation) modulator 122m. The timing signal from the PWM modulator 122m then undergoes automatic frequency control (AFC) and automatic phase control (APC) so as to rotate the disk motor 111 at a constant linear velocity (CLV).

The frequency detector 122m and the phase detector 122l are connected to receive a system clock-pulse from a system clock-pulse generating circuit 122p, which operates under the control of an output signal from a quartz crystal oscillator 122n.

The demodulated data from the input/output control circuit 123a of the second signal processing system 123 is supplied through a data output circuit 123e to a D/A (digital-to-analog) converter 126 after it has undergone necessary error correction, deinterleaving and data supplementation at a syndrome detector 123b, and to an error pointer control circuit 123c, and to an error correction circuit 123d. The second signal processing system 123 includes an external memory control circuit 123f. The control circuit 123f cooperates with the data selecting circuit 122j of the first signal processing system 122 to control an external memory 127 which stores data necessary for correcting errors. Under the control of the circuits 123f and 122j the data are read from the external memory 127 and supplied to the input/output control circuit 123a.

The second signal processing system 123 further comprises a timing control circuit 123g and a muting control circuit 123h. The timing control circuit 123g is so designed as to supply, in response to a system clock-pulse generated by the system clock-pulse generating circuit 122p, a timing control signal which is necessary in correcting errors, supplementing data and converting digital data into analog data. The muting control circuit 123h is so designed as to achieve, in response to a control signal from the error pointer control circuit 123c or from the system controller 117, a specific muting control which is necessary in supplementing data and in starting and ending DAD reproduction.

An audio signal, or an analog output signal from the D/A converter 126 is supplied through a low pass filter 128 and an amplifier 129 to a loudspeaker 130.

In the digital audio disk (DAD) reproduction apparatus which has the arrangement described above, a disk motor control section (corresponding to the frequency detector 122k, the phase detector 122l, and the PWM modulator 122m) will be described in detail as a section (of the apparatus) to which the pulse-width modulation circuit of the present invention is applied.

Figure 2:
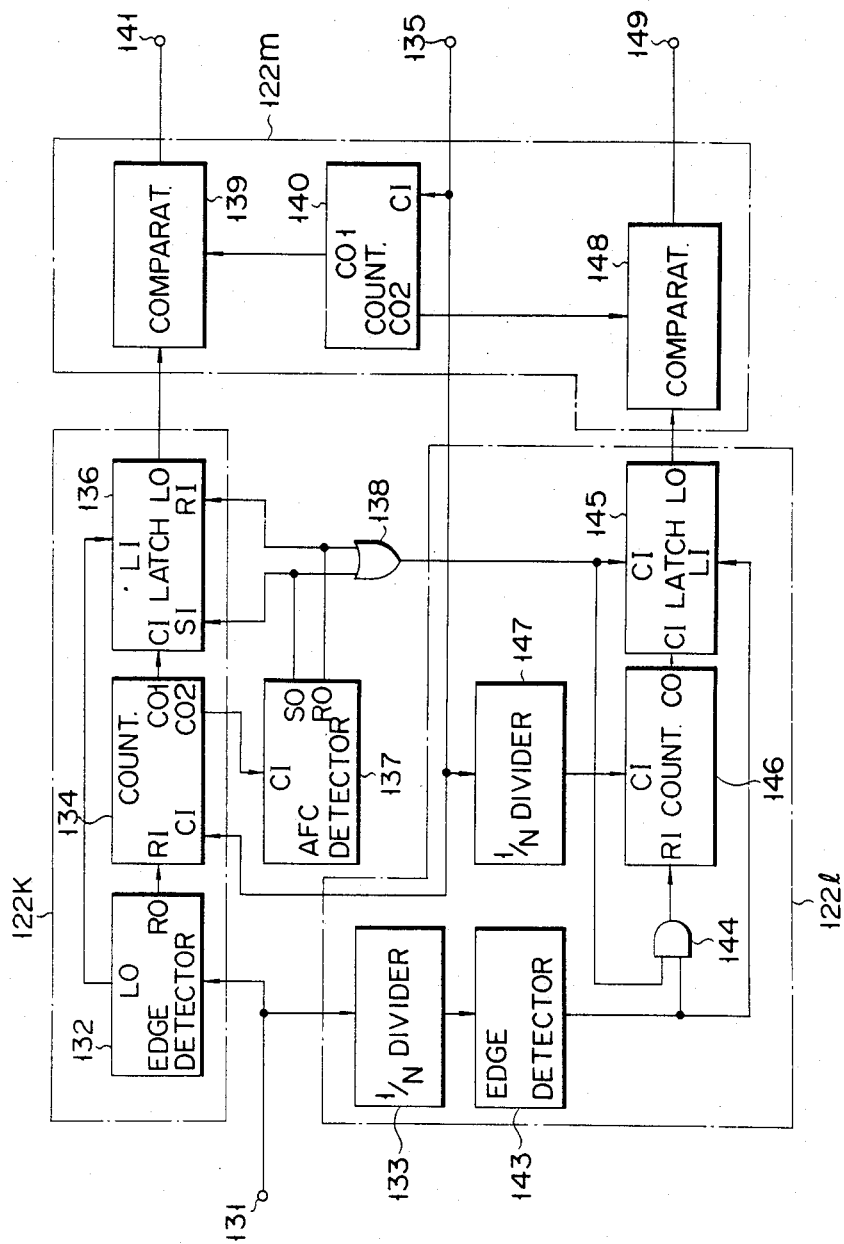
FIG. 2 is a block diagram showing a motor control section of the digital audio disk reproduction apparatus shown in FIG. 1.

Referring to FIG. 2, reference numeral 131 denotes an input end which receives a timing signal from the timing signal generating circuit 122f. The timing signal is obtained by frequency-dividing the sync signal in a predetermined frequency division ratio. Note that the sync signal is produced by the sync signal detector 122c. The timing signal is used to control the rotational speed of the disk motor 111 and is therefore called a control signal. The input end 131 is connected to the input end of an edge detector 132 which is included in the frequency detector 122k. The input end 131 is also connected to the input end of a 1/N divider 133 which is included in the phase detector 122l.

A reset signal output end RO of the edge detector 132 is connected to a reset signal input end RI of a counter 134. A count signal input end CI of the counter 134 is connected to a clock input end 135 of the system clock generating circuit 122p. The clock input end 135 receives the system clock signal. Since the system clock signal is the reference signal to control the disk motor 111 so as to rotate the optical disk 113 at a constant linear velocity, the system clock signal will be called a reference clock signal here. The counter 134 has first and second count signal output ends $CO_1$ and $CO_2$. The first count signal output end $CO_1$ is connected to the count signal input end CI of a latch circuit 136, and the second count signal output end $CO_2$ is connected to the count signal input end CI of an AFC detector 137. Set and reset signal output ends SO and RO of the AFC detector 137 are connected to set and reset signal input ends SI and RI of the latch circuit 136, respectively, and also to the two input ends of a NOR gate 138. A latch pulse output end LO of the edge detector 132 is connected to a latch pulse input end LI of the latch circuit 136.

A latch signal output end LO of the latch circuit 136 is connected to one input end of a comparator 139. The other end of the comparator 139 is connected to a first count signal output end $CO_1$ of a ramp counter 140. The output end of the comparator 139 is connected to the input end of a low-pass filter (LPF) 142 shown in FIG. 1 through a connecting end 141.

The output end of the 1/N divider 133 is connected to one input end of an AND gate 144 through an edge detector 143 and to a latch pulse input end LI of a latch circuit 145. The output end of the AND gate 144 is connected to a reset signal input end RI of a counter 146. A count signal output end CO of the counter 146 is connected to a count signal input end CI of the latch circuit 145. A count signal input end CI of the counter 146 is connected to the output end of a 1/N divider 147. The input end of the 1/N divider 147 is connected to the clock input end 135.

The output end of the OR gate 138 is connected to the other input end of the AND gate 144 and to a control input end CI of the latch circuit 145. A latch signal output end LO of the latch circuit 145 is connected to one input end of a comparator 148. The other input end of the comparator 148 is connected to a second count signal output end $CO_2$ of the ramp counter 140. The count signal input end CI of the ramp counter 140 is connected to the clock input end 135. The output end of the comparator 148 is connected to the input end of the low-pass filter (LPF) 150 shown in FIG. 1 through a connecting end 149.

The mode of operation of the disk motor control section having the arrangement described above will be described with reference to FIGS. 3A to 3I. When the optical disk 113 is rotated and the sync signal shown in FIG. 1 is obtained, the control signal obtained by dividing the sync signal in the predetermined frequency division ratio, as shown in FIG. 3A, is supplied to the input end 131. The edge detector 132 produces a pulse shown in FIG. 3B from the reset signal output end RO and from the latch pulse output end LO thereof every time the edge detector 132 detects the trailing edge of the control signal.

When a reference clock signal is supplied to the count signal input end CI of the ramp detector 140, the ramp detector 140 begins to count the reference clock signals. The ramp counter 140 thus counts the reference clock signals and is automatically reset when the count thereof reaches a predetermined value. In this manner, the ramp counter 140 repeats the counting and resetting operation at a constant frequency. The count signal from the first and second count signal output ends $CO_1$ and $CO_2$ of the ramp counter 140 has a substantially sawtooth waveform and a predetermined period independent of the period of the control signal, as shown in FIG. 3C.

When a reference clock signal is supplied from the clock input end 135 to the count signal input end CI of the counter 134, the counter 134 begins to count the reference clock signals. However, the counter 134 is reset every time the pulse is supplied from the edge detector 132 to the reset signal input end RI thereof. For this reason, the signal from the first and second count signal output ends $CO_1$ and $CO_2$, respectively, of the counter 134 has a substantially sawtooth waveform and a period synchronous with that of the control signal. The count of the counter 134 corresponds to the frequency of the control signal.

A count signal is supplied from the first and second count signal output ends $CO_1$ and $CO_2$ of the counter 134 to the count signal input ends CI of the latch circuit 136 and the AFC detector 137, respectively. The latch circuit 136 holds the count signal supplied to its count signal input end CI every time the signal (FIG. 3B) is supplied from the latch pulse output end LO of the edge detector 132 to the latch pulse input end LI of the latch circuit 136. In other words, the latch circuit 136 produces a hold signal (FIG. 3D) from its latch signal output end LO. The hold signal shown in FIG. 3E is obtained by holding the maximum count signals each having a sawtooth waveform shown in FIG. 3D.

In this case, the holding operation of the latch circuit 136 is controlled by the AFC detector 137. The AFC detector 137 detects whether or not the count (corresponding to the frequency of the control signal) of the counter 134 falls within a predetermined range. More particularly, since the count of the counter 134 corresponds to the frequency of the control signal, the AFC detector 137 detects whether or not the frequency of the control signal falls within a predetermined frequency range.

When the count of the counter 134 does not fall within the predetermined range (i.e., prior to time T1 in FIG. 3), the set signal output end SO or the reset signal output end RO of the AFC detector 137 becomes a high level (to be referred to as H level hereinafter). The circuit designer can determine which one of the set and reset signal output ends SO and RO becomes H level. For example, if the set signal output end SO becomes H level, the latch circuit 136 produces the maximum count signal from its latch signal output end LO independent of the output from the counter 134. However, if the reset signal output end RO goes to H level, the latch signal output end LO of the latch circuit 136 becomes low. Assume that the AFC detector 137 is arranged such that the reset signal output end RO becomes H level when the count of the counter 134 does not fall within the predetermined range.

Figure 3:
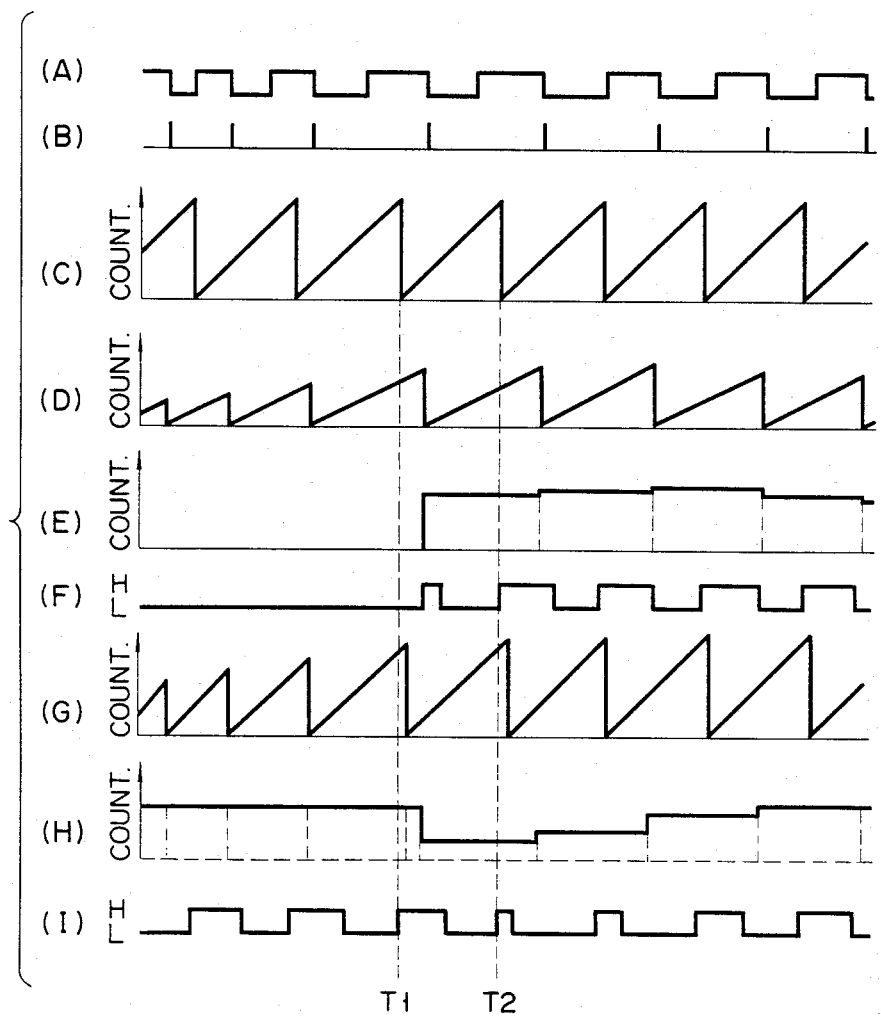
FIGS. 3A to 3I are timing charts for explaining the mode of operation of the motor control section shown in FIG. 2.

When the optical disk 113 is just beginning to be rotated, i.e., prior to time T1 in FIG. 3, the rotational speed of the optical disk 113 is not normal yet. The frequency of the control signal does not fall within the predetermined range. In this condition, the latch signal output end LO of the latch circuit 136 is kept low. The signal of low level (to be referred to as L level hereinafter) from the latch signal output end LO is compared by the comparator 139 with the count signal from the ramp counter 140. When the count signal from the latch circuit 136 is smaller than that of the ramp counter 140, the comparator 139 produces a signal of L level. However, when the count signal from the latch circuit 136 is equal to or larger than that of the ramp detector 140, the comparator 139 produces a signal of H level.

Prior to time T1 in FIG. 3, the output from the comparator 139 is kept at L level, as shown in FIG. 3F. In this condition, a reference voltage $V_{OF}$ (FIG. 4) corresponding to substantially half of an AFC voltage $V_F$ obtained through the low-pass filter 142 in FIG. 1 is applied across the disk motor 111.

Assume that the rotational speed of the optical disk 113 is increased, and that the frequency of the control signal reaches the predetermined frequency range at time T1 in FIG. 3. The reset signal output end RO of the AFC detector 137 becomes L level. The latch circuit 136 then starts the holding operation. The count of the hold signal is compared by the comparator 139 with the count of the ramp counter 140. The comparator 139 then produces an automatic frequency control signal (to be referred to as an AFC signal hereinafter) as shown in FIG. 3F. More particularly, the count signal of the latch circuit 136 which corresponds to the frequency of the control signal is compared with the count signal of the counter 140 which has the reference period. A pulse-width modulated signal corresponding to a deviation in the frequency of the control signal with respect to the reference frequency is produced as the AFC signal. The AFC signal is supplied as an AFC voltage $V_F$ to the disk motor 111 through the low-pass filter 142 shown in FIG. 1.

Figure 4:
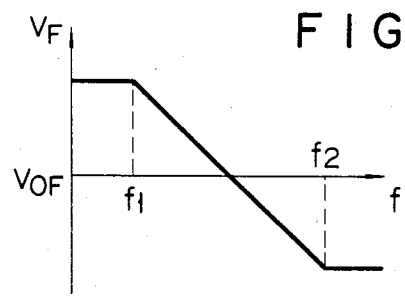
FIGS. 4 and 5, respectively, are timing charts for explaining motor control signals of the motor control section shown in FIG. 2.

FIG. 4 shows the relationship between frequency f of the control signal and the AFC voltage $V_F$. Automatic frequency control can be performed when the frequency f of the control signal falls within a range between frequencies f1 and f2. The AFC detector 137 detects whether or not the frequency of the control signal falls within the range between the frequencies f1 and f2.

The control signal is supplied from the input end 131 to the edge detector 143 through the 1/N divider 133. The edge detector 143 produces a pulse shown in FIG. 3B every time it detects the trailing edge of the control signal. In this case, the control signal is equivalent to the signal which is shown in FIG. 3A and which is obtained through the 1/N divider 133, so that the control signal is described referring to the signal shown in FIG. 3A.

When a reference clock signal is supplied from the clock input end 135 to the count signal input end CI of the counter 146 through the 1/N divider 147, the counter 146 begins to count the signals which are obtained by 1/N dividing the reference clock signals. When automatic frequency control is not performed (i.e., prior to time T1 in FIG. 3), the reset signal output end RO of the AFC detector 137 is kept at H level. The output end of the OR gate 138 is then kept at H level. The pulse from the edge detector 143 is supplied to the reset signal input end RI of the counter 146 through the AND gate 144. The counter 146 is reset every time the pulse is supplied from the edge detector 143 to the reset signal input end RI of the counter 146. The count signal from the counter 146 is changed, as shown in FIG. 3G.

The count signal from the counter 146 is supplied from its count signal output end CO to the count signal input end CI of the latch circuit 145. The latch circuit 145 holds the count signal supplied to the count signal input end CI thereof every time the pulse is supplied from the edge detector 143 to the latch pulse input end LI of the latch circuit 145. However, prior to time T1 in FIG. 3, the output end of the OR gate 138 is kept at H level, so that the control input end CI of the latch circuit 145 is kept at H level. In this condition, the output from the latch circuit 145 is kept at a given level, as shown in FIG. 3H. The given count signal from the latch circuit 145 is compared by the comparator 148 with the count signal from the ramp counter 140. The given count signal from the latch circuit 145 has a voltage equal to half the maximum count signal from the ramp counter 140. When the count signal from the latch circuit 145 is smaller than the count signal from the ramp counter 140, the comparator 148 produces a signal of L level. However, when the count signal from the latch circuit 145 is equal to or larger than that from the ramp counter 140, the comparator 148 produces a signal of H level.

The comparator 139 then produces a pulse which has a predetermined period prior to time T1 as shown in FIG. 3I. In this condition, a reference voltage $V_{op}$ (FIG. 5) corresponding to half (50% duty) of an APC voltage $V_p$ obtained through the low-pass filter 150 shown in FIG. 1 is applied across the disk motor 111.

At time T1 in FIG. 3, the reset signal output end RO of the AFC detector 137 becomes L level. The reset signal input end RI of the counter 146 does not then receive the pulse from the edge detector 143. The counter 146 counts the signals (FIG. 3G), which are supplied to its count signal input end CI independently of the control signal, to a predetermined value, and is then automatically reset. In this manner, the counter 146 repeats the counting and resetting operation. Since the control input end CI of the latch circuit 145 is kept at L level, the latch circuit 145 performs the holding operation described above. The latch circuit holds the output from the counter 146 every time the pulse is supplied from the edge detector 143 thereto, as shown in FIG. 3H. The count signal from the latch circuit 145 is compared by the comparator 148 with the count signal from the ramp counter 140. The comparator 148 produces an automatic phase control signal (to be referred to as an APC signal hereinafter) at time T2, as shown in FIG. 3I. More particularly, a signal obtained by holding the output from the counter 146 having the period of the control signal, is compared with the count signal from the counter 140 which has a reference period (phase). A pulse-width modulated signal corresponding to a deviation in the phase of the control signal with respect to the phase of the reference signal is produced as the APC signal. The APC signal is supplied as an APC voltage $V_p$ to the disk motor 111 through the low-pass filter 150 shown in FIG. 1.

Figure 5:
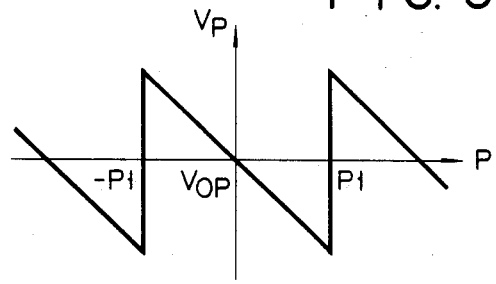

FIG. 5 shows the relationship between the deviation in phase P of the control signal and the APC voltage $V_p$. Automatic phase control can be performed when the deviation in phase of the control signal falls within a range between $+P1$ and $-P1$. Automatic phase control is performed after the frequency of the control signal falls within the frequency range between f1 and f2 as shown in FIG. 4.

The AFC and APC voltage signals are superposed on one another. A resultant composite signal is used to drive the disk motor 111, and hence, the optical disk 113 at a constant linear velocity.

In the pulse-width modulation circuit which has the arrangement described above, prior to automatic phase control being performed (i.e., prior to time T1 in FIG. 3), the APC signal has substantially 50% duty of the controllable range. Even if the APC signal is made to have substantially 100% duty so as to actually perform automatic phase control at time T2 in FIG. 3, the voltage applied across the disk motor 111 is changed with respect to the voltage $V_{op}$ in FIG. 5, so that the rotational speed of the disk motor 111 may not be greatly changed, thus properly controlling the smooth rotation of the disk motor 111. However, when automatic phase control is not performed, the counter 146 is operated so as to render the control signal in phase with the reference signal, so that the disk motor 111 is properly controlled. In this manner, phase control is roughly performed before automatic phase control is started, thus decreasing idle time. Furthermore, automatic phase control is smoothly started, thus assuring stable and smooth rotation of the disk motor 111.

It is noted that the 1/N dividers 133 and 147 serve to control a ratio of an AFC gain to an APC gain.

Figure 6:
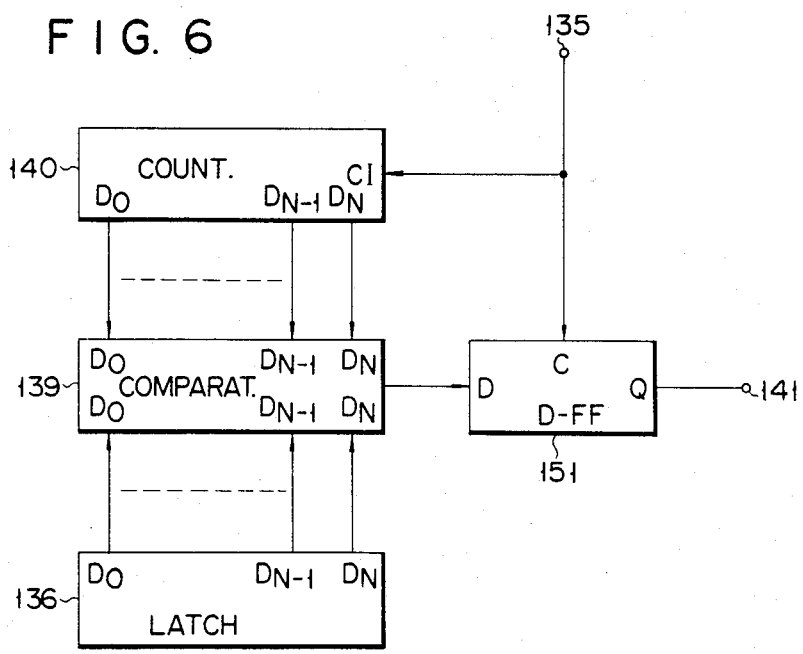
FIG. 6 is a block diagram showing a pulse-width modulating means used in the motor control section shown in FIG. 2.

The conventional PWM modulating means which comprises the ramp counter 140, the comparator 139 and the latch circuit 136 will now be described in detail; only the PWM modulation circuit for generating the AFC signal is described. Since the PWM modulation circuit for generating the APC signal using the comparator 148 and the latch circuit 145 is substantially the same as that for generating the AFC signal, a detailed description thereof will be omitted. Referring to FIG. 6, the ramp counter 140 comprises an n-bit counter, the comparator 139 comprises an n-bit comparator, and the latch circuit 136 comprises an n-bit latch circuit. The count signal from the latch circuit 136 is compared by the comparator 139 with the count signal from the ramp counter 140. When the count signal from the latch circuit 136 is smaller than that from the ramp counter 140, the comparator 139 produces a signal of H level. Otherwise, the comparator 139 produces a signal of L level. The output from the comparator 139 is supplied to a D flip-flop (to be referred to as a DFF) 151 which is latched by the reference clock signal supplied from the clock input end 135. A delayed signal from the DFF 151 appears at the connecting end 141. This delayed signal corresponds to a pulse-width modulated signal (i.e., AFC signal).

However, in the conventional pulse-width modulating means shown in FIG. 6, the ramp counter 140, the comparator 139 and the latch circuit 136 comprise n-bit elements, resulting in high cost.

According to the present invention, the number of bits of the comparators 139 and 148 and the ramp counter 140 may be decreased, resulting in reduced cost, although the pulse-width modulation operation can still be performed at high speed.

Figure 7:
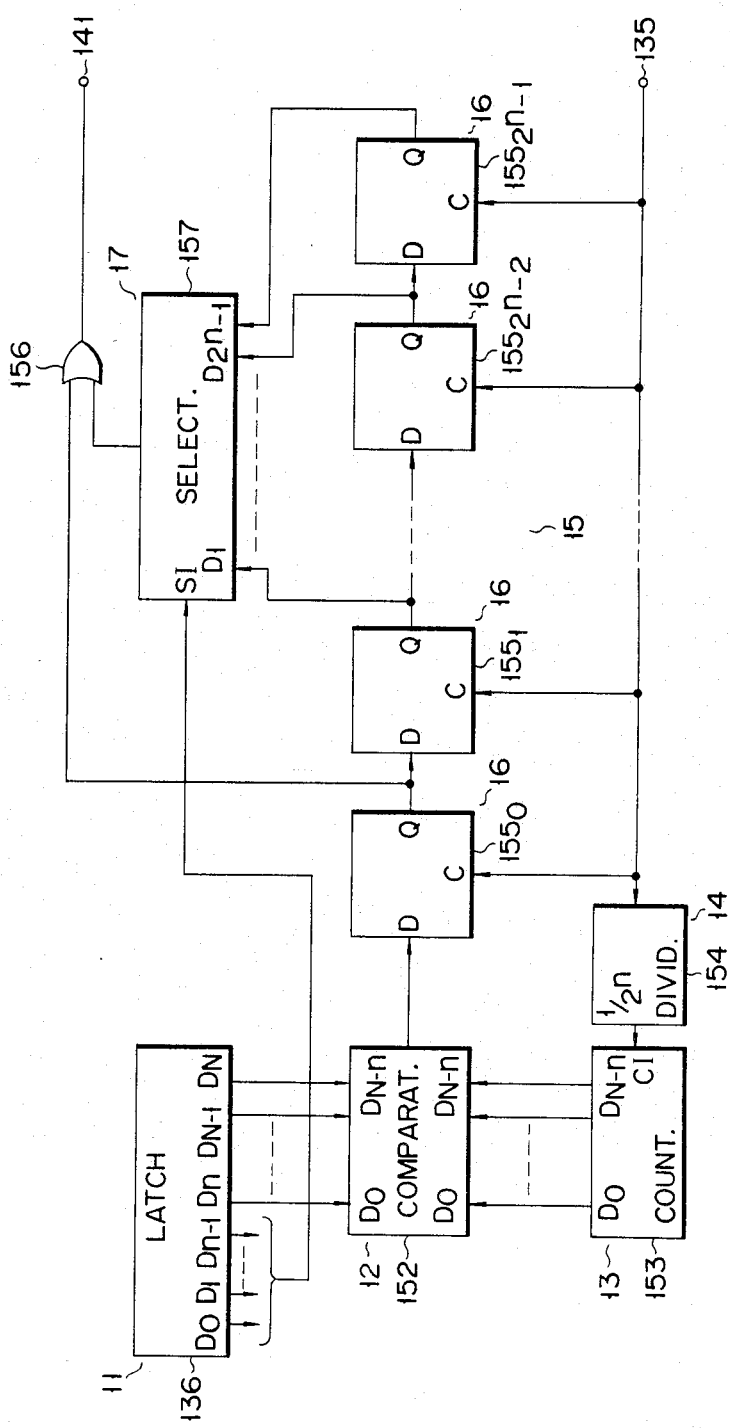
FIG. 7 is a block diagram showing a pulse-width modulation circuit according to an embodiment of the present invention.

Referring to FIG. 7, the latch signal output end LO of the latch circuit 136 as a latching means 11 comprises output pins $D_0$ to $D_N$ of a total of $(N+1)$ bits. The output pins $D_n$ to $D_N$, i.e., excluding the LSB output pin $D_0$ to the nth bit output pin $D_{n-1}$ and totalling $(N-n+1)$ bits, are respectively connected to one set of input pins $D_0$ to $D_{N-n}$ of a comparator 152 as a comparing means 12. Note that the one set of input pins $D_0$ to $D_{N-n}$ of the comparator 152 comprises a total of $(N-n+1)$ bits.

The other set of input pins $D_0$ to $D_{N-n}$ of the comparator 152 are connected to output pins $D_0$ to $D_{N-n}$, respectively, of a ramp counter 153 as a counting means 13. The output pins $D_0$ to $D_{N-n}$ have a total of $(N-n+1)$ bits. A count signal input end CI of the ramp counter 153 is connected to the output end of a $\frac{1}{2^n}$ divider 154 as a frequency dividing means 14.

The ramp counter 153 repeats the counting and resetting operation such that it is automatically reset every time its count of the clock signal from the $\frac{1}{2^n}$ frequency divider 154 reaches a predetermined value. The comparator 152 produces a signal of L level when the count signal from the latch circuit 136 is smaller than that from the ramp counter 153 in the same manner as does the comparator 139. When the count signal from the latch circuit 136 is equal to or larger than that from the ramp counter 153, the comparator 152 produces a signal of H level. The $\frac{1}{2^n}$ divider 154 divides by $\frac{1}{2^n}$ the frequency of the reference clock signal from the clock input end 135.

The output end of the comparator 152 is connected to a delay input end D of a first DFF $155_0$ among $2^n$ DFFs $155_0$ to $155_{2n-1}$ as a flip-flop 16 which constitutes a delaying means 15. Clock input ends C of the DFFs $155_0$ to $155_{2n-1}$ are commonly connected to the clock input end 135.

An output end Q of the DFF $155_0$ is connected to one input end of an OR gate 156. Output ends Q of the DFFs $155_1$ to $155_{2n-1}$ are connected to input pins $D_1$ to $D_{2n-1}$, respectively, of a data selector 157 as a data selecting means 17. The input pins $D_1$ to $D_{2n-1}$ correspond to a total of $(2^n-1)$ bits. The LSB output pin $D_0$ to the nth bit output pin $D_{n-1}$ of the latch circuit 136 are connected to an n-bit control pin SI of the data selector 157. The data selector 157 selectively produces signals supplied to the input pins $D_1$ to $D_{2n-1}$ in accordance with the $2^n$ possible combinations of the H and L level signals applied to its control pin SI.

The mode of operation of the pulse-width modulation circuit having the arrangement described above will be described with reference to timing charts shown in FIGS. 8A to 8D. The reference clock signal (FIG. 8A) supplied from the clock input end 135 is frequency-divided by the $\frac{1}{2^n}$ divider 154. The divided signals are counted by the $(N-n+1)$-bit ramp counter 153. Meanwhile, the latch circuit 136 holds the count signal from the counter 134 which counts the reference clock signals shown in FIG. 8A.

The count data, except for the LSB to nth bit data of the latch circuit 136, is compared by the comparator 152 with the count data of the ramp counter 153. In this case, the signals obtained by frequency-dividing the reference clock signal by $\frac{1}{2}^n$ are counted by the ramp counter 153 and correspond to the count data therefrom (corresponding to the n-bit carry in binary notation), whereas the count data supplied from the latch circuit 136 to the comparator 152 correspond to the count data except for the LSB to nth bit data. The count data from the latch circuit 136 is compared with that from the ramp counter 153 on the same basis (corresponding bits).

Assume that the LSB to nth-bit data of the latch circuit 136 is not considered, and that the count of the ramp counter 153 is cleared at predetermined time Ta and becomes smaller than the count of the latch circuit 136. The comparator 152 produces a signal of H level as shown in FIG. 8B. The output end Q of the DFF $155_0$ goes to H level at time $T_{a0}$ in synchronism with the reference clock signal, as shown in FIG. 8C(0). The output ends Q of the DFFs $155_1$ to $155_{2^n-1}$ sequentially go to H level at times $T_{a1}$ to $T_{a2^n-1}$, each being sequentially delayed by one clock pulse as shown in FIGS. 8C(1) to 8C($2^n-1$), in the order named.

Assume that the count of the ramp counter 153 is gradually increased and becomes equal to that of the latch circuit 136 at predetermined time Tb. The output from the comparator 152 goes to L level, as shown in FIG. 8B. The output end Q of the DFF $155_0$ goes to L level in synchronism with the reference clock signal at time $Tb_0$, as shown in FIG. 8C(0). The output ends Q of the DFFs $155_1$ to $155_{2^n-1}$ sequentially go to H level at times $T_{b1}$ to $T_{b2^n-1}$, each being sequentially delayed by one clock pulse, as shown in FIGS. 8D(1) to 8D($2^n-1$).

The relationship between the data selector 157 and the data corresponding to the signals from the LSB output pin $D_0$ to the nth-bit output pin $D_{n-1}$ of the latch circuit 136 will now be described. The signals of L and H levels from the n output pins $D_0$ to $D_{n-1}$ of the latch circuit 136 have $2^n$ possible combinations. The data selector 157 selectively produces signals, according to those which are supplied to its input pins $D_1$ to $D_{2^n-1}$, from its output end. When all the output pins $D_0$ to $D_{n-1}$ of the latch circuit 136 are set at L level, the output end of the data selector 157 is also set at L level.

Figure 8:
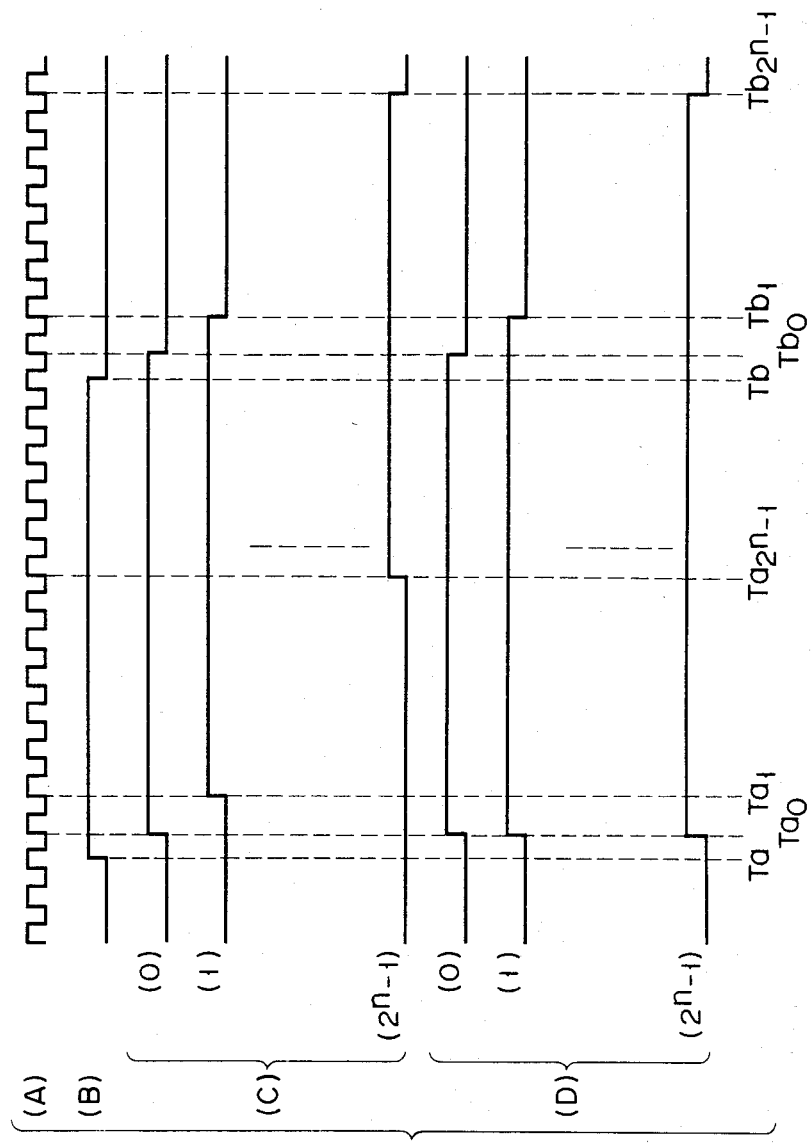
FIGS. 8A to 8D are timing charts for explaining the mode of operation of the pulse-width modulation circuit shown in FIG. 7.

When the output end Q of the DFF $155_0$ goes to H level at time $Ta_0$ in FIG. 8, the signal of H level from this output end is supplied to the connecting end 141 through the OR gate 156. At the same time, the data selector 157 selectively produces the signals shown in FIGS. 8C(1) to 8C($2^n-1$) in accordance with the $2^n$ possible combinations and supplies them to the connecting end 141 through the OR gate 156. The AFC signal appearing at the connecting end 141 is one of the signals shown in FIGS. 8D(0) to 8D($2^n-1$).

The signals shown in FIGS. 8C(1) to 8C($2^n-1$) are selectively added to the pulse-width modulated signal (FIG. 8C(0)) or are not added (when all the output pins $D_0$ to $D_{n-1}$ of the latch circuit 136 are kept at L level) thereto. As described above, the pulse-width modulated signal is obtained by comparing the count data, excluding the LSB to nth-bit data, of the latch circuit 136 and the count signal from the ramp counter 153. As a result, the number of bits of the comparator 152 and the ramp counter 153 can be decreased by n bits, while pulse-width modulation can still be performed, thus resulting in low cost and high speed.

Figure 9:
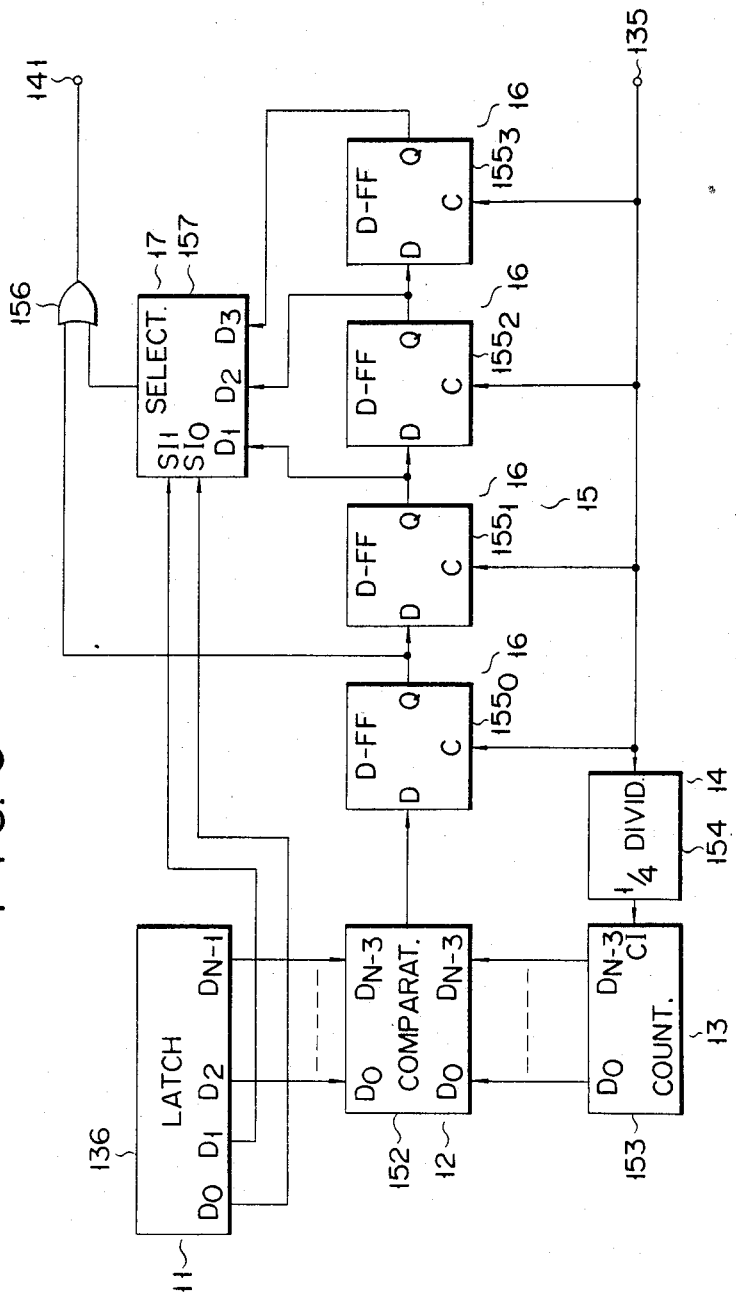
FIG. 9 is a block diagram showing a modification of the pulse-width modulation circuit (FIG. 7) when a data area is decreased by 2 bits.

FIG. 9 shows a case in which the number of bits of the comparator 152 and the ramp counter 153 is decreased by 2 bits, when the N-bit latch circuit 136 is used. In other words, an (N−2)-bit comparator 152 and an (N−2) ramp counter 153 are used. Accordingly, the $\frac{1}{2}^n$ frequency divider 154 has a frequency division ratio of $\frac{1}{4}(=\frac{1}{2}^2)$ for n=2.

The mode of operation of the pulse-width modulation circuit shown in FIG. 9 will be described with reference to timing charts shown in FIGS. 10A to 10I. The reference clock signal (FIG. 10A) supplied from the clock input end 135 is frequency-divided by the $\frac{1}{4}$ frequency divider 153 and is counted by the (N−2)-bit ramp counter 153. Meanwhile, the latch circuit 136 holds the signal obtained from the counter 134 by counting the reference clock signal (FIG. 10A) as described with reference to FIG. 2.

The count data, except for the LSB and next less significant bit data, from the latch circuit 136 is compared by the comparator 152 with the count data of the ramp counter 153. In this case, the signals obtained by frequency-dividing the reference clock signal by $\frac{1}{4}$ are counted by the ramp counter 153 and correspond to the count data therefrom (corresponding to the 2-bit carry in the binary notation), whereas the count data supplied from the latch circuit 136 to the comparator 152 is the count data excluding the LSB and second less significant bit data. The count data from the latch circuit 136 is compared with that from the ramp counter 153 on the same basis (corresponding bits).

Figure 10:
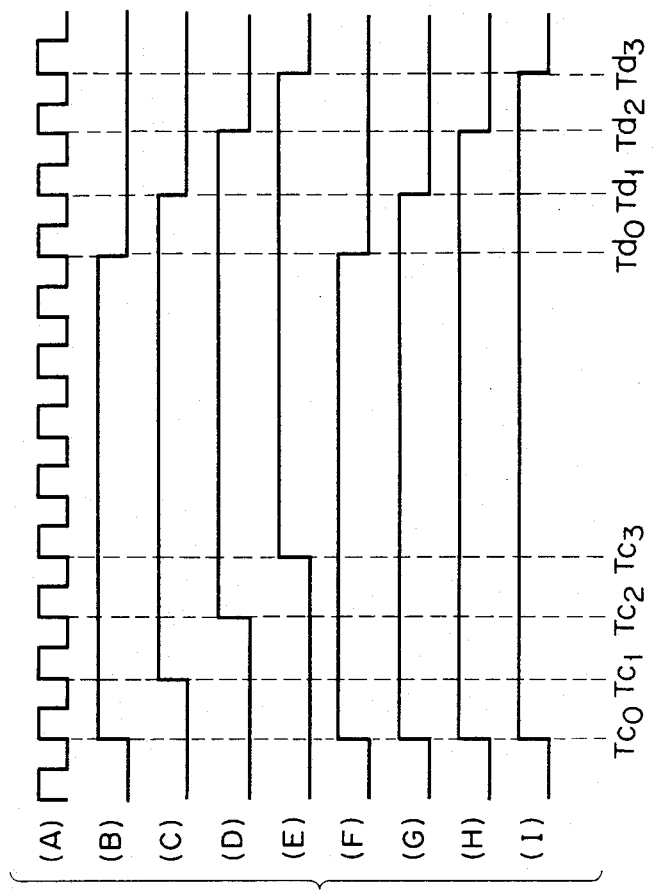
FIGS. 10A to 10I are timing charts for explaining the mode of operation of the circuit shown in FIG. 9.

Assume that two bits starting from the LSB of the latch circuit 136 are not considered, and that the count of the ramp counter 153 is reset at a predetermined time and becomes smaller than that of the ramp counter 153. The output from the comparator 152 goes to H level. The output end Q of the DFF $155_0$ goes to H level at time $T_{c0}$ in synchronism with the reference clock signal, as shown in FIG. 10B. The output ends Q of the DFFs $155_1$ to $155_3$ sequentially go to H level in the order named at times $T_{c1}$ to $T_{c3}$, each being sequentially delayed by one clock pulse, as shown in FIGS. 10C to 10E.

Thereafter, the count of the ramp counter 153 is gradually increased and becomes equal to or larger than the count of the latch circuit 136 at the predetermined time, and the output from the comparator 152 goes to L level. The output end Q of the DFF $155_0$ goes to L level at time $T_{d0}$ in synchronism with the reference clock signal, as shown in FIG. 10B. The output ends Q of the DFFs $155_1$ to $155_3$ sequentially go to L level at times $T_{d1}$ to time $T_{d3}$, respectively, each being sequentially delayed by one clock pulse, as shown in FIGS. 10C to 10E.

The relationship between the data corresponding to the signals from the output pins $D_1$ and $D_0$ of the latch circuit 136 and the data selector 157 will now be described. The signals from the output pins $D_1$ and $D_0$ of the latch circuit 136 have four possible combinations: (L, L), (L, H), (H, L) and (H, H). The data selector 157 is controlled to produce the signals shown in the following table from its output end in accordance with the four combinations.

| $D_1$ | $D_0$ | Output End of Data Selector 157 |
|---|---|---|
| L | L | L |
| L | H | Signal from $D_1$ |

-continued

| $D_1$ | $D_0$ | Output End of Data Selector 157 |
|---|---|---|
| H | L | Signal from $D_2$ |
| H | H | Signal from $D_3$ |

When both signals from the output pins $D_1$ and $D_0$ are set at L level, the output end of the data selector 157 perforce becomes L level. When the signals from the output pins $D_0$ and $D_1$ have logic level combinations of "L, H", "H, L" and "H, H", the data selector 157 is operated to produce signals appearing at the input pins $D_1$, $D_2$ and $D_3$, respectively.

When the output end Q of the DFF $155_0$ becomes high at time $T_{c0}$, the AFC signal produced from the connecting end 141 through the OR gate 156 in accordance with the combinations of signals from the output pins $D_1$ and $D_0$ is one of the signals shown in FIGS. 10F to 10I. The signals shown in FIGS. 10A to 10E are selectively added to the pulse-width modulated signal (FIG. 10B) or are not added thereto. As described above, the pulse-width modulated signal is obtained by comparing the count data, except for the LSB and the second less significant bit data, of the latch circuit 136 with the count data from the ramp counter 153. The number of bits of the comparator 152 and the ramp counter 153 can be decreased by 2 bits, thus resulting in low cost and high speed.

FIG. 11 shows a modification of the pulse-width modulation circuit (FIG. 7), wherein an (N−1)-bit comparator 152 and ramp counter 153 are used, but an (N)-bit latch circuit 136 is used. The $\frac{1}{2}^n$ frequency divider 154 has a frequency division ratio of $\frac{1}{2}$ ($=\frac{1}{2}^1$) for n=1.

The mode of operation of the pulse-width modulation circuit shown in FIG. 11 will be described with reference to timing charts shown in FIGS. 12A to 12E. The reference clock pulse (FIG. 12A) is supplied from a clock input end 135 to a $\frac{1}{2}$ frequency divider 154. The frequency-divided signal is then counted by the (N−1)-bit ramp counter 153. Meanwhile, the latch circuit 136 holds the output from the counter 134 which counts the reference clock pulses shown in FIG. 12A in the same manner as in FIG. 2.

The count data, except for the LSB data, of the latch circuit 136 is compared by the comparator 152 with the count data from the ramp counter 153. In this case, the output data (corresponding to 1-bit carry in binary notation) from the ramp counter 153 corresponds to count data obtained by counting the $\frac{1}{2}$-divided signals, whereas the count data from the latch circuit 136 corresponds to the count data excluding the LSB data. As a result, these count data are compared on the same basis (corresponding bits).

Assume that the LSB of the latch circuit 136 is not considered, and that the count of the ramp counter 153 is reset at a predetermined time and becomes smaller than the count of the latch circuit 136. The output from the comparator 152 becomes H level. The output end Q of the DFF $155_0$ then becomes H level at time $T_{c0}$ in synchronism with the reference clock signal, as shown in FIG. 12B. The output end Q of the DFF $155_1$ goes to H level at time $T_{e1}$, being delayed by one clock pulse, as shown in FIG. 12C.

Assume that the count of the ramp counter 153 is gradually increased and becomes equal to or larger than the count of the latch circuit 136. The output from the comparator 152 becomes L level. The output end Q of the DFF $155_0$ becomes L level at time $T_{f0}$ in synchronism with the reference clock signal, as shown in FIG. 12B. The output end Q of the DFF $155_1$ then becomes L level at time $T_{f1}$, being delayed by one clock pulse, as shown in FIG. 12C.

The signal from the LSB output pin $D_0$ of the latch circuit 136 has two possible logic level combinations: "H" and "L". When the output pin $D_0$ is set at L level, the AND gate 157 as the data selecting means 17 is disabled. As a result, the AFC signal appearing at the connecting end 141 through the OR gate 156 is shown in FIG. 12D. However, when the output pin $D_0$ is set at H level, the AND gate 157 is enabled. As a result, the AFC signal appearing at the connecting end 141 is shown in FIG. 12E. The signal shown in FIG. 12E is added to the pulse-width modulated signal (FIG. 12D) or is not added thereto in accordance with the logic level of the signal produced at the LSB output pin $D_0$. Note that the pulse-width modulated signal is obtained by comparing the count data, except for the LSB data, of the latch circuit 136 with the count data of the ramp counter 152. Even if the number of bits of the comparator 152 and the ramp counter 153 is decreased by one bit, pulse-width modulation of the AFC signal can be properly performed.

What we claim is:

1. A pulse-width modulation circuit, characterized by comprising:
   N-bit latching means for holding count data obtained by counting a reference clock signal in accordance with a period of a signal to be modulated;
   frequency dividing means for frequency-dividing the reference clock signal by $\frac{1}{2}^n$ (N>n);
   (N−n)-bit counting means for counting an output from said frequency dividing means at a predetermined period;
   comparing means for comparing (N−n)-bit count data from said counting means and (N−n)-bit count data which is held in said latching means and which excludes n-bit data starting from a least significant bit of said latching means, and for producing a pulse-width modulation signal;
   delaying means for producing delayed signals by delaying outputs from said comparing means by single pulses of the reference clock signal, the delayed signals corresponding to the number of logic level combinations of the n-bit data starting from the least significant bit of said latching means; and
   selecting means for selecting the delayed signals from said delaying means in accordance with the number of logic level combinations of the n-bit data starting from the least significant bit of said latching means, and for adding at least one selected signal to the pulse-width modulation signal.

2. A circuit according to claim 1, wherein said counting means repeats counting and resetting operations such that said counting means counts the output from said frequency dividing means to a predetermined value and is then automatically reset.

3. A circuit according to claim 2, wherein said delaying means comprises a plurality of flip-flops each of which sets an input signal in synchronism with the reference clock signal.

* * * * *